(12) United States Patent
Meng

(10) Patent No.: US 12,347,702 B2
(45) Date of Patent: Jul. 1, 2025

(54) WET PROCESSING SYSTEM AND SYSTEM AND METHOD FOR MANUFACTURING SEMICONDUCTOR STRUCTURE

(71) Applicant: TAIWAN SEMICONDUCTOR MANUFACTURING COMPANY LTD., Hsinchu (TW)

(72) Inventor: Ying-Chieh Meng, Taichung (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 315 days.

(21) Appl. No.: 17/824,926

(22) Filed: May 26, 2022

(65) Prior Publication Data

US 2023/0386870 A1 Nov. 30, 2023

(51) Int. Cl.
*H01L 21/67* (2006.01)
*H01L 21/677* (2006.01)
*H01L 21/687* (2006.01)

(52) U.S. Cl.
CPC .. *H01L 21/67201* (2013.01); *H01L 21/67742* (2013.01); *H01L 21/67778* (2013.01); *H01L 21/68714* (2013.01)

(58) Field of Classification Search
CPC ........... H01L 21/67201; H01L 21/6719; H01L 21/67778; H01L 21/67742; H01L 21/67745; H01L 21/68714; H01L 21/67196; H01L 21/67184; H01L 21/67754; H01L 21/67161; H01L 21/67167; H01L 21/67173; H01L 21/67207; H01L 21/67213; H01L 21/67219; H01L 21/67225; H01L 21/6723; H01L 21/67155

See application file for complete search history.

(56) References Cited

U.S. PATENT DOCUMENTS

| | | | |
|---|---|---|---|
| 2003/0053893 A1* | 3/2003 | Matsunaga | C23C 16/54 414/217 |
| 2009/0016853 A1* | 1/2009 | Yoo | H01L 21/67288 414/217.1 |
| 2015/0235815 A1* | 8/2015 | Gomi | H01J 37/32733 204/298.27 |
| 2020/0335386 A1* | 10/2020 | Hung | H01L 21/6719 |
| 2021/0175100 A1* | 6/2021 | Rice | H01L 21/67196 |
| 2021/0305075 A1* | 9/2021 | Jeon | H01L 21/67766 |
| 2022/0213594 A1* | 7/2022 | Yamagishi | H01L 21/67017 |
| 2024/0105478 A1* | 3/2024 | Dokan | H01L 21/67201 |

* cited by examiner

*Primary Examiner* — Glenn F Myers
(74) *Attorney, Agent, or Firm* — WPAT LAW; Anthony King

(57) ABSTRACT

A semiconductor structure manufacturing system is provided. The system includes a load lock chamber, first chambers, second chambers and a first robot. The load lock chamber is configured to store wafers that are to be processed. The first chambers are configured to process the wafers. Each of the first chambers has first stage plates for supporting the wafers. The second chambers are configured to process a single wafer. Each of the second chambers has a second stage plate for supporting a wafer. The first robot is configured to transport the wafers from the load lock chamber to the first chambers. The first robot is arranged between the first chambers, the second chambers and the load lock chamber.

20 Claims, 8 Drawing Sheets

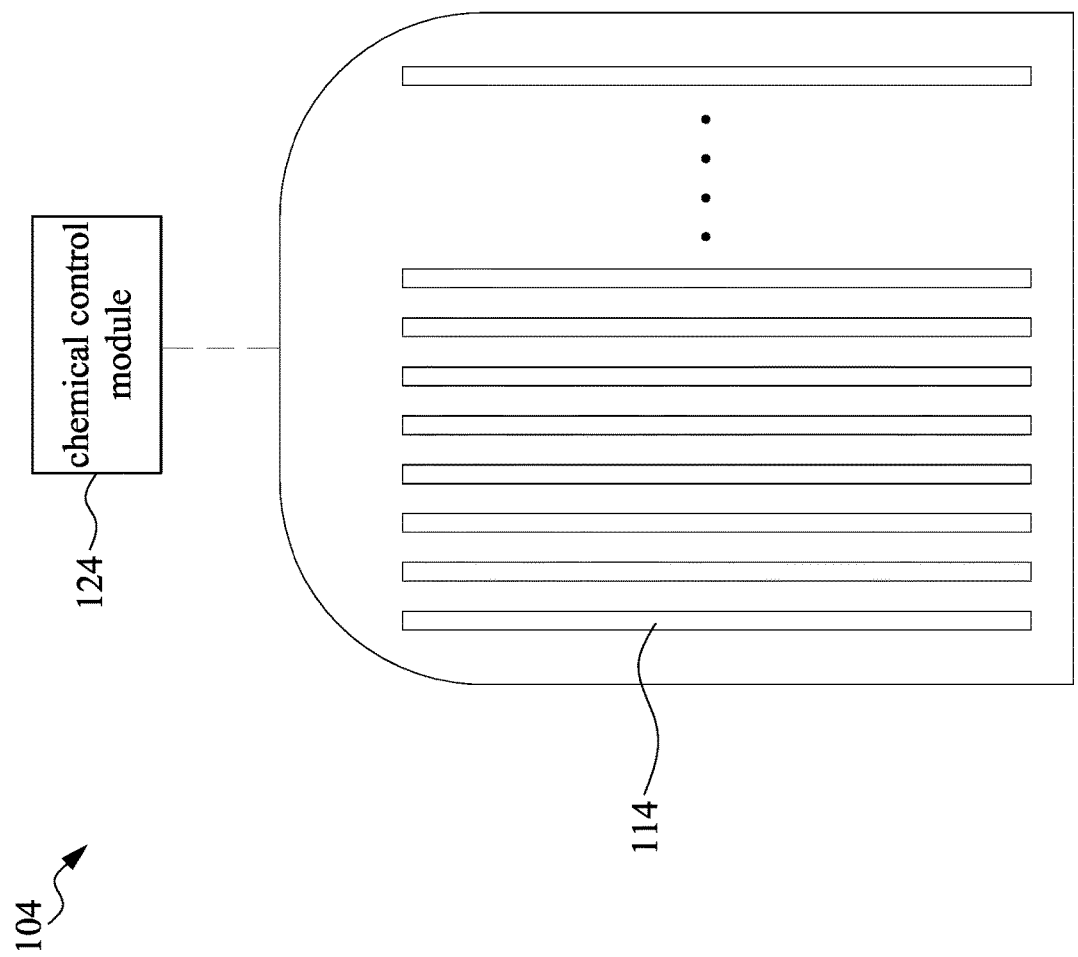

WET PROCESSING SYSTEM AND SYSTEM AND METHOD FOR MANUFACTURING SEMICONDUCTOR STRUCTURE

BACKGROUND

The fabrication of semiconductor devices includes hundreds of individual steps performed on a wafer. For example, the steps may include oxidation, diffusion, ion implantation, thin film deposition, cleaning, etching and lithography. Processing chambers for such steps have been designed as multiple processing stations or modules, wherein different processing chambers are designed to perform certain types of processing operations. However, transportation between different processing chambers is time consuming and a yield of the semiconductor devices may be influenced by the processing procedure.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

FIG. 2A is a schematic top view of a first chamber according to aspects of one or more embodiments of the present disclosure.

DETAILED DESCRIPTION

Figure 1:
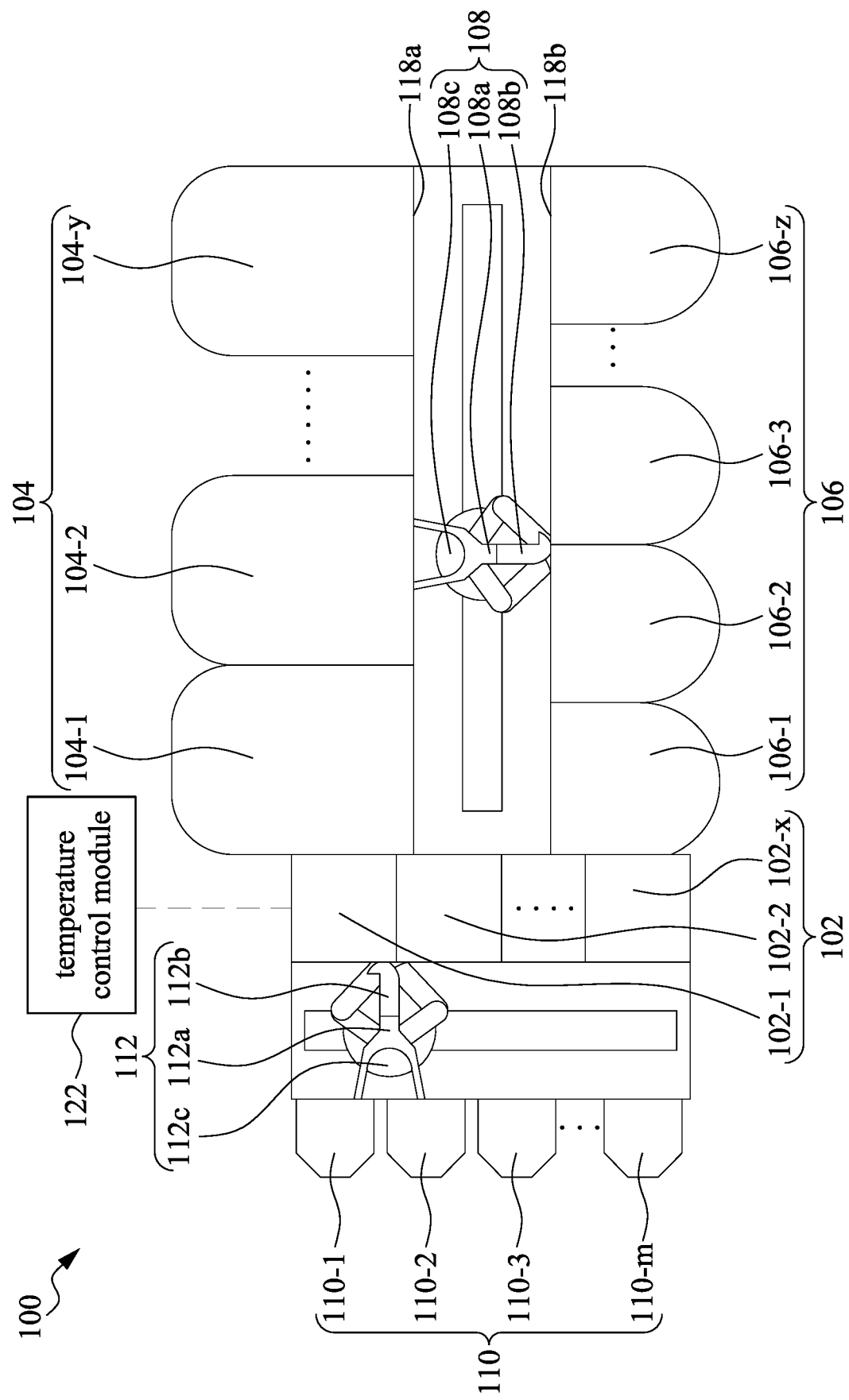
FIG. 1 is a schematic top view of a semiconductor structure manufacturing system according to aspects of one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Some embodiments of the present disclosure provide a system for wet processing, a system for manufacturing a semiconductor structure, and a method for manufacturing a semiconductor structure that provides one or more improvements over existing approaches. The present disclosure provides a system that integrates a bath-type tool and a single-type tool. By integrating the bath-type tool and the single-type tool as introduced below, transportation time between different processing chambers may be reduced. In addition, a footprint of such system may be reduced, and cleanroom space may be saved. Furthermore, a yield of the semiconductor structures may be improved due to in-situ processing procedure.

FIG. 1 is a schematic top view of a semiconductor structure manufacturing system 100 according to aspects of one or more embodiments of the present disclosure. In some embodiments of the present disclosure, the semiconductor structure manufacturing system 100 may include one or more load lock chambers 102, one or more first chambers 104, one or more second chambers 106 and a first robot 108. The first robot 108 may be arranged between the first chambers 104, the second chambers 106 and the load lock chambers 102. In some embodiments, the first chambers 104 and the second chambers 108 are arranged on different sides of the first robot 108. For example, the first chambers 104 are arranged on a first side 118a of the first robot 108, while the second chambers 106 are arranged on a second side 118b of the first robot 108.

Figure 2B:
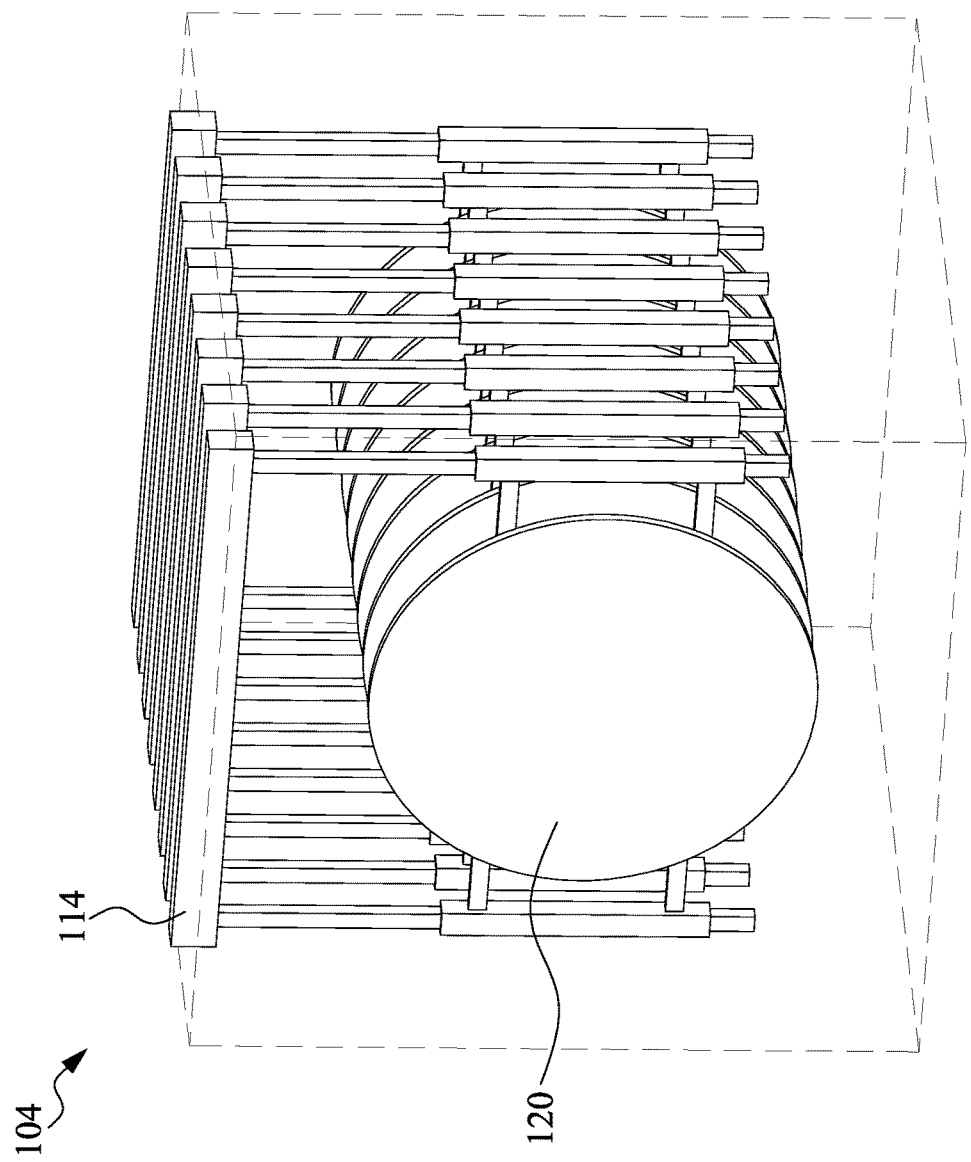
FIG. 2B is a schematic view of the first chamber according to aspects of one or more embodiments of the present disclosure.
Figure 3:
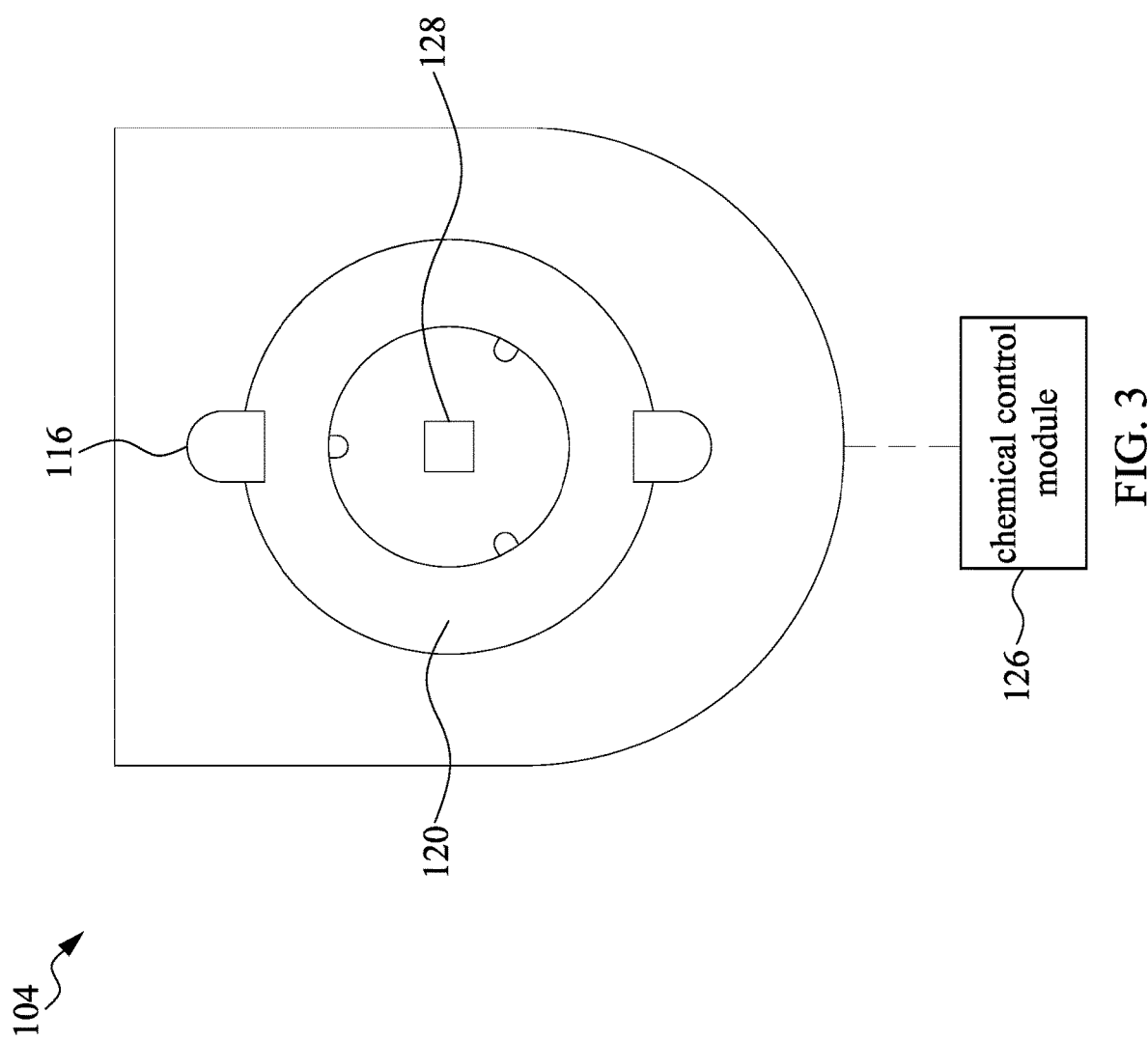
FIG. 3 is a schematic top view of a second chamber according to aspects of one or more embodiments of the present disclosure.

In some embodiments of the present disclosure, the semiconductor structure manufacturing system 100 may be configured to process one or more substrates 120 (as shown in FIGS. 2A, 2B and FIG. 3). In some embodiments, the substrate 120 may be a wafer that includes one or more semiconductor layer(s), conductor(s), and/or insulator layer(s). The semiconductor layer(s) may include an elementary semiconductor such as silicon or germanium with a crystalline, polycrystalline, amorphous, and/or other suitable structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof. In some embodiments, combinations of semiconductors may take the form of a mixture or a gradient such as a wafer in which the ratio of Si and Ge vary across locations. In some embodiments, the substrate 120 includes layered semiconductors. For example, the layered semiconductors may be disposed on an insulator to produce a silicon-on-insulator (SOI) wafer, a silicon-on-sapphire wafer, or a silicon-germanium-on-insulator wafer. Alternatively, the layered semiconductors may be disposed on a glass to produce a thin film transistor (TFT). In some embodiments, the substrate 120 may undergo many processing steps. For example, the substrate 120 may be subjected to an etching process and/or a cleaning process.

In some embodiments of the present disclosure, the processing chambers (i.e., the first chamber 104 or the second chamber 106) of the semiconductor structure manufacturing system 100 may be configured to perform any manufacturing procedure on the substrate 120. In some embodiments, the processing chambers (i.e., the first chamber 104 or the second chamber 106) may be configured to perform wet processes. Examples of the wet processes include a wet etching process, a cleaning process (such as a rinsing process and/or a plasma ashing process), and combinations thereof. In some embodiments, the first chambers 104 and the second chambers 106 may include different processing chemicals. In some alternative embodiments, the first chambers 104 and the second chambers 106 may include a same processing chemical. Details of the processing chambers (i.e., the first chamber 104 or the second chamber 106) will be described with reference to FIGS. 2A, 2B and FIG. 3.

FIG. 2A is a schematic top view of the first chamber 104 according to aspects of one or more embodiments of the present disclosure. FIG. 2B is a schematic view of the first chamber 104 according to aspects of one or more embodiments of the present disclosure. In some embodiments, the first chambers 104 may be configured to process more than one of the substrates 120. In some embodiments, each of the first chambers 104 has more than one first stage plates 114 for supporting the substrates 120. In some embodiments, the first chamber 104 is configured as a bath-type tool (or a batch-type tool), which may be configured to process one or more batches of the substrates 120 in a single manufacturing process. For example, the substrates 120 in one first chamber 104 may be subjected to a same wet process. In some embodiments, the first chamber 104 is connected to a chemical control module 124. The chemical control module 124 may be configured to supply desired chemicals to the first chamber 104. In some embodiments, multiple first chambers 104 are connected to a single chemical control module 124. Alternatively or additionally, each of the first chambers 104 may include functions such as spin-dry bath, ultrasonic vibration, or other suitable functions.

FIG. 3 is a schematic top view of the second chamber 106 according to aspects of one or more embodiments of the present disclosure. In some embodiments, each of the second chambers 106 may be configured to process a single substrate 120. In some embodiments, the second chamber 106 is configured as a single-type tool, which may be configured to process only one of the substrates 120 in a single manufacturing process. In some embodiments, the second chamber 106 is connected to a chemical control module 126. The chemical control module 126 may be configured to supply desired chemicals to the second chamber 106. In some embodiments, multiple second chambers 106 are connected to a single chemical control module 126. Alternatively, the first chambers 104 and second chambers 106 are connected to a same chemical control module. In some embodiments, each of the second chambers 106 may include functions such as spin-dry bath, ultrasonic vibration, vapor/steam or other suitable functions. In some embodiments, the second chamber 106 may further include one or more nozzles 128. The nozzle 128 may be a jet-dispense nozzle, DI (deionized water) spray nozzle, or another suitable nozzle.

Referring to FIG. 1 again, in some embodiments, the first robot 108 (which is sometimes referred to as a center robot) includes a transportation fork 108a, a transportation robot arm 108b and a transportation stage 108c. The transportation fork 108a may be connected to the transportation robot arm 108b such that the transportation fork 108a is able to rotate freely. In some embodiments, the transportation fork 108a may be inserted into the processing chamber (i.e., the first chamber 104 or the second chamber 106) to acquire one or more processed substrates (i.e., the substrate 120). Next, the transportation fork 108a may transport the substrate 120 into the load lock chamber 102 or other process chambers (i.e., the first chamber 104 or the second chamber 106) for further processes. Alternatively, the transportation fork 108a may be inserted into the load lock chamber 102 to acquire one or more substrates that are to be processed (i.e., the substrate 120). Next, the transportation fork 108a may transport the substrate 120 into the processing chamber (i.e., the first chamber 104 or the second chamber 106).

In some embodiments, the load lock chamber 102 may be configured to store one or more substrates 120 that are to be processed or one or more processed substrates 120. In some embodiments, when the substrate 120 is transported from the processing chamber (i.e., the first chamber 104 or the second chamber 106) into the load lock chamber 102, the load lock chamber 102 is sealed. Alternatively or additionally, the load lock chamber 102 may be capable of creating an atmosphere compatible with the processing chamber (i.e., the first chamber 104 or the second chamber 106) depending on where the loaded substrate 120 is to be placed next. For example, the gas content within the load lock chamber 102 may be altered to adjust the atmosphere within the load lock chamber 102. The gas content may be adjusted by mechanisms such as addition of gas, creation of vacuum, and/or other suitable methods. When the atmosphere within the load lock chamber 102 matches the atmosphere within the processing chamber (i.e., the first chamber 104 or the second chamber 106), a substrate loading-unloading port (not shown) of the load lock chamber 102 may be opened, and the substrate 120 located inside the load lock chamber 102 may be accessed.

Alternatively or additionally, the load lock chamber 102 may be connected to a temperature control module 122. The temperature control module 122 may be configured to control a temperature of the respective load lock chamber 102. In some embodiments, the load lock chamber 102 may be configured to cool the processed substrates 120. In such embodiments, the temperature control module 122 may inject a cooling gas into the internal cavity of the load lock chamber 102. In some embodiments, the cooling gas includes clean dry air. Alternatively or additionally, the cooling gas includes an inert gas. The cooling gas may be selected from the group consisting of nitrogen, argon, helium, and combinations thereof. In some embodiments, a temperature of the cooling gas is less than room temperature. In some embodiments, the load lock chamber 102 may be configured to pre-heat the substrates 120 that are to be processed. In such embodiments, the temperature control module 122 may inject a heating gas into the internal cavity of the load lock chamber 102. In some embodiments, the heating gas includes clean dry air. Alternatively or additionally, the heating gas includes an inert gas. The heating gas may be selected from the group consisting of nitrogen, argon, helium, and combinations thereof. In some embodiments, a temperature of the heating gas is greater than room temperature. In some alternative embodiments, the load lock chamber 102 may be capable of reducing the impact of chemical residues on the surfaces of the processed substrates 120 by injecting an inert gas. The inert gas may be selected from the group consisting of nitrogen, argon, helium, and combinations thereof.

As illustrated in FIG. 1, the load lock chambers 102, the first chambers 104, the second chambers 106, and the first robot 108 are spatially connected with each other. In other words, the load lock chambers 102, the first chambers 104, and the second chambers 106 are all connected with each other through the first robot 108. In this way, the substrate 120 may be transported freely among the load lock chambers 102, the first chambers 104, and the second chambers 106. For example, the processed substrates 120 may respectively be transported from the first chamber 104-1 into the second chamber 106-1 and the second chamber 106-2.

In some embodiments, the semiconductor structure manufacturing system 100 may further include one or more load ports 110 and a second robot 112. The substrate 120 may be loaded through the load port 110. In some embodiments, the load port 110 may be configured to accommodate one or more cassettes (not shown). The cassette may be a front-opening unified pod (FOUP), a front-opening shipping box (FOSB), a standard mechanical interface (SMIF) pod, or another suitable container. In some embodiments, the cassettes may be transferred from a stocker (not shown) to the load port 110 by an overhead hoist transport (OHT; not shown). In some embodiments, the cassettes are containers for holding one or more substrates 120 and for transporting the substrates 120 between manufacturing tools. In some embodiments, the cassettes may have features such as coupling locations and electronic tags to facilitate use with an automated materials handling system. In some embodiments, the cassettes are sealed in order to provide a micro-environment for the substrate 120 contained within to avoid contamination. To prevent loss of the controlled atmosphere, each cassette may have a door specifically designed such that the cassette remains sealed until it is docked with the load port 110.

In some embodiments, the second robot 112 (which is sometimes referred to as a front robot) includes a transportation fork 112*a*, a transportation robot arm 112*b* and a transportation stage 112*c*. The transportation fork 112*a* may be connected to the transportation robot arm 112*b* such that the transportation fork 112*a* is able to rotate freely. In some embodiments, the transportation fork 112*a* may be inserted into the load lock chamber 102 to acquire one or more processed substrates (i.e., the substrate 120). Next, the transportation fork 112*a* may transport the substrate 120 into the load port 110. Alternatively, the transportation fork 112*a* may be inserted into the load port 110 to acquire one or more substrates that are to be processed (i.e., the substrate 120). Next, the transportation fork 112*a* may transport the substrate 120 into the load lock chamber 102. In some embodiments, when the substrate 120 is transported from the load port 110 into the load lock chamber 102, the load lock chamber 102 is sealed. In some embodiments, the load lock chamber 102 may be capable of creating an atmosphere compatible with the load port 110.

In some embodiments, the second robot 112 allows the substrate 120 to be transported among the load ports 110 and the load lock chambers 102 in any direction. In some embodiments, the loaded substrates 120 in different load ports 110 (e.g., load ports 110-1 and 110-2) may be subjected to a same manufacturing procedure. The second robot 112 may be configured to acquire the loaded substrates 120 in different load ports 110 that are subjected to a same manufacturing procedure, and then transport the loaded substrates 120 into a single load lock chamber 102. Thereafter, the first robot 108 may be configured to acquire the loaded substrates 120 in the single load lock chamber 102 to the respective processing chambers (i.e., the first chamber 104 or the second chamber 106).

In some embodiments, the semiconductor structure manufacturing system 100 allows the substrate 120 to be transported by the first robot 108 and the second robot 112 in any direction among the processing chambers (i.e., the first chamber 104 or the second chamber 106), the load lock chambers 102, and the load ports 110. For example, the substrate 120 may be transported from the processing chamber (i.e., the first chamber 104 or the second chamber 106) to the load port 110 via the first robot 108, the load lock chamber 102, and the second robot 112 in sequential order. In some alternative embodiments, the substrate 100 may be transported from the load port 110 to the processing chamber (i.e., the first chamber 104 or the second chamber 106) via the second robot 112, the load lock chamber 102, and the first robot 108 in sequential order.

In some embodiments of the present disclosure, the semiconductor structure manufacturing system 100 allows the substrate 120 to be transported by the first robot 108 in any direction among different processing chambers (i.e., the first chamber 104 or the second chamber 106). For example, the substrate 120 may be transported from the first chamber 104 to the second chamber 106 by the first robot 108. In some alternative embodiments, the substrate 120 may be transported from the second chamber 106 to the first chamber 104 by the first robot 108. Alternatively, the substrate 120 may be transported from the first chamber 104 to the second chamber 106 via the load lock chamber 102.

As shown in FIG. 1, for a depicted embodiment, a number of the load ports 110 is m, a number of the load lock chambers 102 is x, a number of the first chambers 104 is y, and a number of the second chambers 106 is z, wherein m, x, y and z are integers. The number of the load ports 110, the number of the load lock chambers 102, the number of the first chambers 104, and the number of the second chambers 106 may be altered according to different implementations. In some embodiments, the number of the first chambers 104 is equal to the number of the second chambers 106. In some alternative embodiments, the number of the second chambers 106 is greater than the number of the first chambers 104.

The present disclosure provides embodiments of a semiconductor structure manufacturing system 100 that provide one or more improvements over existing approaches. The first chambers 104 are configured to perform batch processing, in which multiple substrates 120 are processed at the same time, while the second chambers 106 are configured to perform single wafer processing, in which only a single substrate 120 is processed at a time. The batch processing may be a cost-effective approach, while the processing of individual wafers (single wafer processing) may enhance process control and achieve finer features. By integrating the first chambers 104 and the second chambers 106 in the semiconductor structure manufacturing system 100, transportation time between different processing chambers (different processing modules) may be reduced. In addition, a footprint of the semiconductor structure manufacturing system 100 may be reduced, thereby saving space in a cleanroom. Furthermore, by integrating the first chambers 104 and the second chambers 106 in the semiconductor structure manufacturing system 100, a yield of the semiconductor structures may be improved due to in-situ processing procedure.

The systems of the present disclosure are not limited to the above-mentioned embodiments and may have other embodiments. To simplify the description and for convenience of comparison between each of the embodiments of the present disclosure, identical (or like) components in each of the following embodiments are marked with identical (or like) numerals. For making it easier to compare differences between the embodiments, the following description will detail dissimilarities among different embodiments, while descriptions of identical features, values and definitions will not be repeated.

Figure 4:
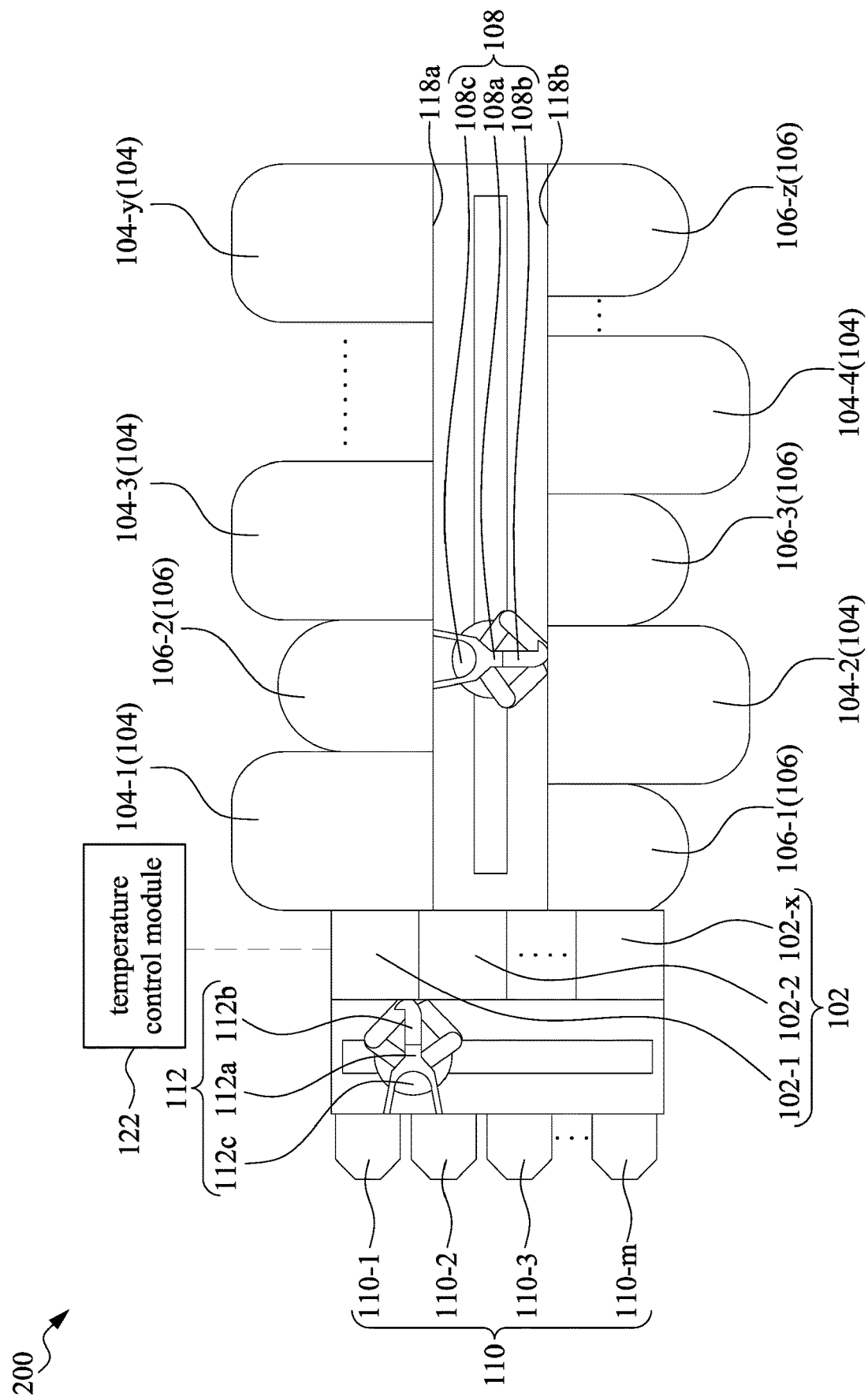
FIG. 4 is a schematic top view of a semiconductor structure manufacturing system according to aspects of one or more embodiments of the present disclosure.

FIG. 4 is a schematic top view of a semiconductor structure manufacturing system 200 according to aspects of one or more embodiments of the present disclosure. In some embodiments, the semiconductor structure manufacturing system 200 may include one or more load lock chambers 102, one or more first chambers 104, one or more second chambers 106, a first robot 108, one or more load ports 110 and a second robot 112. The first robot 108 may be arranged between the first chambers 104, the second chambers 106 and the load lock chambers 102. The second robot 112 may be arranged between the load ports 110 and the load lock chambers 102. In some embodiments, the first chambers 104 and the second chambers 106 are arranged in an alternating order on a first side 118a and a second side 118b of the first robot 108.

Figure 5:
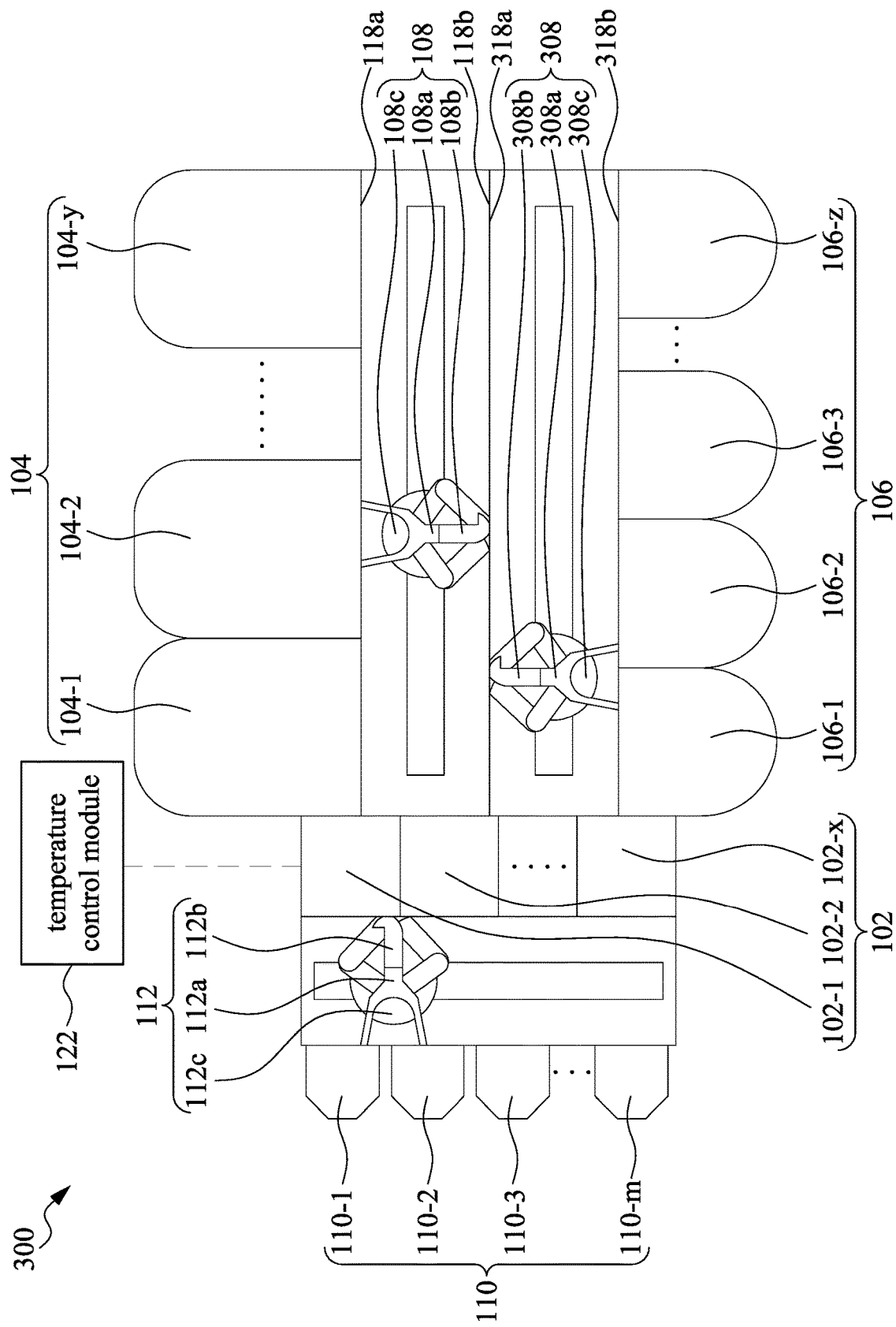
FIG. 5 is a schematic top view of a semiconductor structure manufacturing system according to aspects of one or more embodiments of the present disclosure.

FIG. 5 is a schematic top view of a semiconductor structure manufacturing system 300 according to aspects of one or more embodiments of the present disclosure. In some embodiments, the semiconductor structure manufacturing system 300 may include one or more load lock chambers 102, one or more first chambers 104, one or more second chambers 106, and one or more load ports 110. The semiconductor structure manufacturing system 300 may further include a first robot 108, a second robot 112 and a third robot 308. The second robot 112 may be arranged between the load ports 110 and the load lock chambers 102. The first robot 108 and the third robot 308 may be arranged between the first chambers 104, the second chambers 106 and the load lock chambers 102. In some embodiments, a second side 118b of the first robot 108 faces a first side 318a of the third robot 308. In some embodiments, the first robot 108 is arranged adjacent to the first chambers 104, and the third robot 308 is arranged adjacent to the second chambers 106. For example, the first chambers 104 are arranged on a first side 118a of the first robot 108, while the second chambers 106 are arranged on a second side 308b of the third robot 308. In some alternative embodiments, the first chambers 104 and the second chambers 108 are arranged in an alternating order on the first side 118a of the first robot 108 and the second side 318b of the third robot 308.

In some embodiments, the first robot 108 is configured to transport the substrates 120 between the load lock chamber 102 and the first chambers 104, while the third robot 308 is configured to transport the substrates 120 between the load lock chamber 102 and the second chambers 106. In some embodiments, the third robot 308 (which is sometimes referred to as a center robot) includes a transportation fork 308a, a transportation robot arm 308b and a transportation stage 308c. The transportation fork 308a may be connected to the transportation robot arm 308b such that the transportation fork 308a is able to rotate freely. In some embodiments, the transportation fork 308a may be inserted into the second chambers 106 to acquire one or more processed substrates 120. Next, the transportation fork 308a may transport the substrate 120 into the load lock chamber 102 for further processes. Alternatively, the transportation fork 308a may be inserted into the load lock chamber 102 to acquire one or more substrates 120 that are to be processed. Next, the transportation fork 308a may transport the substrate 120 into the second chambers 106.

Figure 6:
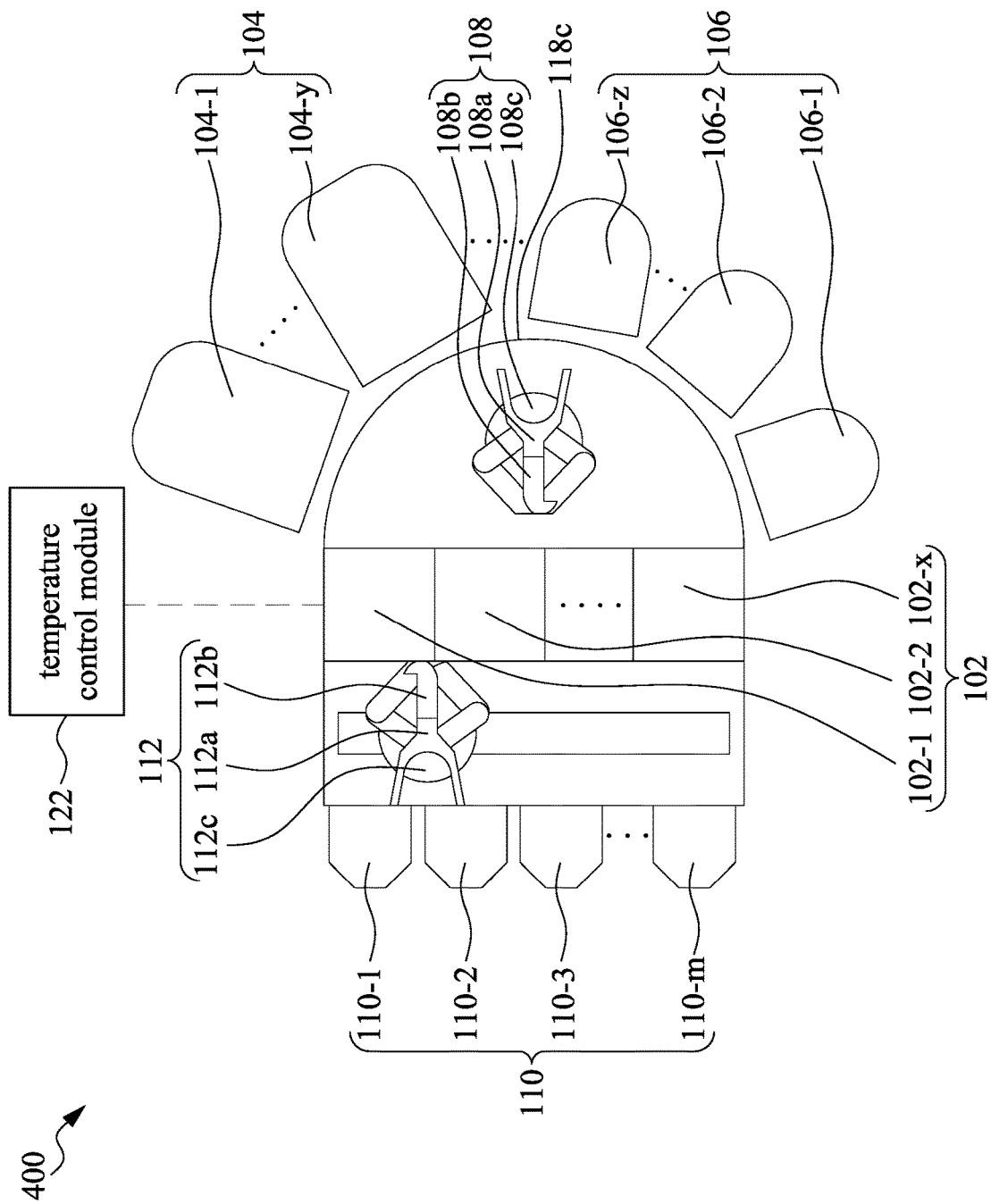
FIG. 6 is a schematic top view of a semiconductor structure manufacturing system according to aspects of one or more embodiments of the present disclosure.

FIG. 6 is a schematic top view of a semiconductor structure manufacturing system 400 according to aspects of one or more embodiments of the present disclosure. In some embodiments, the semiconductor structure manufacturing system 400 may include one or more load lock chambers 102, one or more first chambers 104, one or more second chambers 106, and one or more load ports 110. The semiconductor structure manufacturing system 400 may further include a first robot 108 and a second robot 112. The first robot 108 may be arranged between the first chambers 104, the second chambers 106 and the load lock chambers 102. The second robot 112 may be arranged between the load ports 110 and the load lock chambers 102. In some embodiments, the first chambers 104 and the second chambers 106 are disposed together on a side 118c of the first robot 108. In some alternative embodiments, the first chambers 104 and the second chambers 108 are arranged in an alternating order on the side 118c of the first robot 108.

Figure 7:
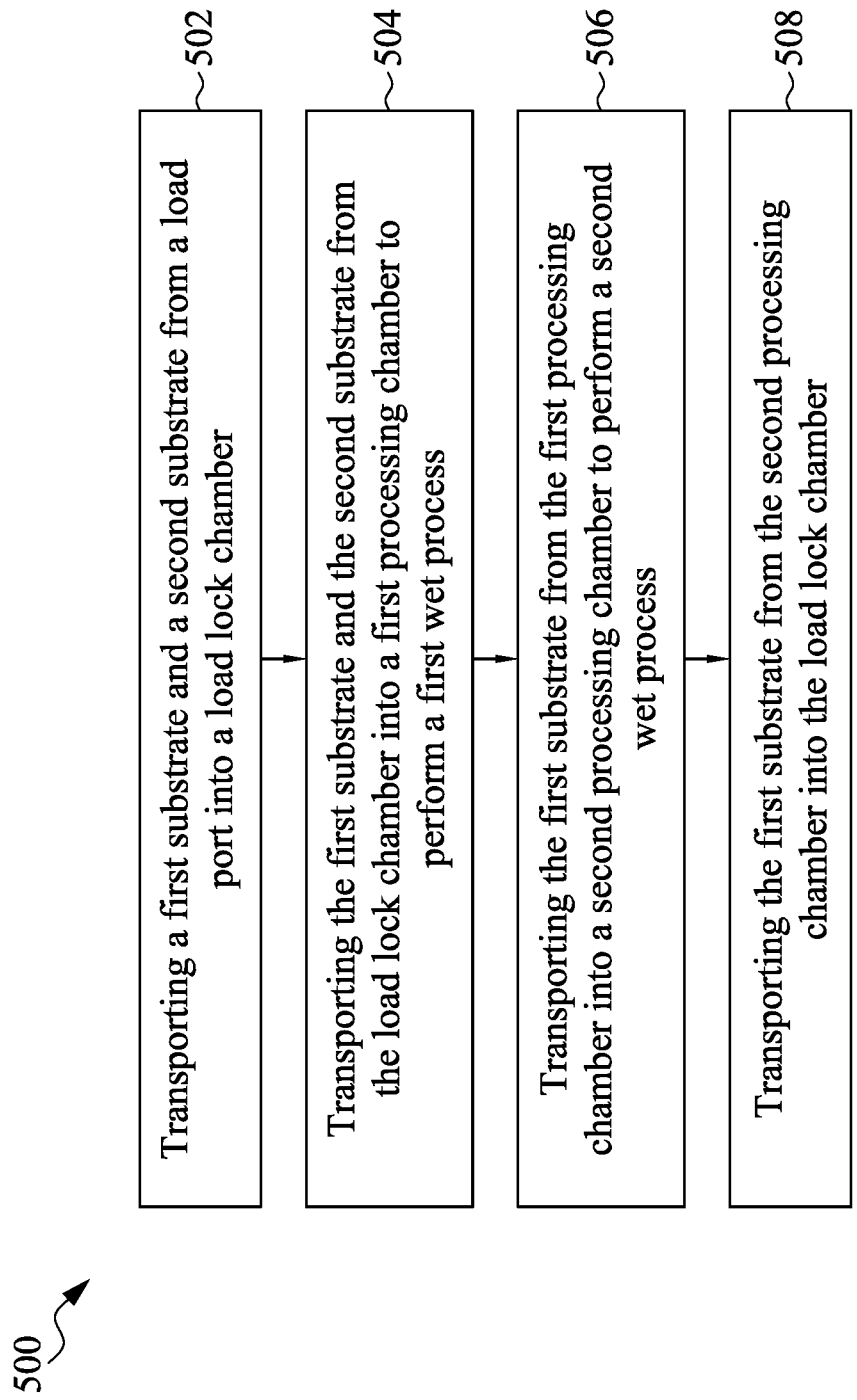
FIG. 7 is a flowchart representing exemplary operations of a method for manufacturing a semiconductor structure by the semiconductor structure manufacturing system according to aspects of one or more embodiments of the present disclosure.

FIG. 7 is a flowchart representing exemplary operations of a method 500 for manufacturing of a semiconductor structure by the semiconductor structure manufacturing system according to aspects of one or more embodiments of the present disclosure.

The method 500 begins at operation 502 by transporting a first substrate and a second substrate (i.e., the substrates 120) from a load port 110 into a load lock chamber 102. In some embodiments, the first substrate and the second substrate are unprocessed substrates loaded in a single load port 110 (e.g., load port 110-1). In some embodiments, the first substrate and the second substrate are transferred from the load port 110 to a single load lock chamber 102 (e.g., load lock chamber 102-1) by a second robot 112. In some alternative embodiments, the first substrate and the second substrate are initially loaded in different load ports 110. For example, the first substrate is loaded in the load port 110-1, while the second substrate is loaded in a load port 110-2. Next, the first substrate is transported from the load port 110-1 and the second substrate is transported from the load port 110-2 to the load lock chamber 102-1. In some alternative embodiments, the first substrate and the second substrate are transported to different load lock chambers 102. For example, the first substrate is transported to the load lock chamber 102-1, while the second substrate is transported to a load lock chamber 102-2.

In some embodiments, after the first substrate and the second substrate are received in the load lock chamber 102, an environment of the load lock chamber 102 is changed to be compatible with the processing chamber (i.e., the first chamber 104 or the second chamber 106) depending on where the loaded substrate 120 is to be placed next. For example, the load lock chamber 102 may be evacuated to a pressure substantially equal to that of the processing chamber. Alternatively or additionally, a temperature of the load lock chamber 102 may be varied by the temperature control module 122 to a temperature substantially equal to that of the processing chamber. For example, the first substrate and the second substrate may be pre-heated to a target temperature to facilitate the manufacturing procedures in the corresponding processing chamber.

At operation 504, the first substrate and the second substrate are transported from the load lock chamber 102 into a first processing chamber (e.g., the first chamber 104) to perform a first wet process. In some embodiments, the first processing chamber has a plurality of first stage plates (e.g., the first stage plates 114) for supporting the first substrate and the second substrate. Examples of the first wet process may include a wet etching process and/or a cleaning process. For example, the first wet process may include APM ($NH_4OH/H_2O_2/H_2O$) cleaning, HPM ($HCl/H_2O_2/H_2O$) cleaning, SPM ($H_2SO_4/H_2O_2$) cleaning, and/or DHF ($HF/H_2O$) cleaning. The APM cleaning may be used to remove particles from surfaces of the first substrate and the second substrate. The HPM cleaning may be used to remove metallic contaminants from the surfaces of the first substrate and the second substrate. The SPM cleaning may be used to remove organic contaminants from the surfaces of the first substrate and the second substrate. The DHF cleaning may be used to remove native oxide from the surfaces of the first substrate and the second substrate. In some embodiments, the first substrate and the second substrate may optionally undergo one or more processes in the first processing chamber.

At operation 506, the first substrate is transported from the first processing chamber into a second processing chamber (e.g., the second chamber 106) to perform a second wet process. In some embodiments, the second processing chamber has a second stage plate (e.g., the second stage plate 116) for supporting the first substrate. Examples of the second wet process may include a wet etching process and/or a cleaning process. For example, the second wet process may include soft spray cleaning and/or backside brushing. The soft spray cleaning may be used to remove particles from the surfaces of the first substrate and the second substrate by spraying DI water onto the surfaces using nitrogen gas. The backside brushing may be used to remove particles from backside surfaces of the first substrate and the second substrate. In some embodiments, the first substrate may optionally undergo one or more processes in the second processing chamber.

In some embodiments, the second wet process is different from the first wet process. In other words, the first wet process and the second wet process include different processing chemicals. Alternatively, the second wet process may be substantially same as the first wet process. In other words, the first wet process and the second wet process include a same processing chemical. In some embodiments, a cleaning effect of the second wet process is better than that of the first wet process due to enhanced (finer) process control of the processed first substrate.

In some embodiments, the method 500 further includes detecting and analyzing the first substrate and the second substrate after the first wet process by an analyzer (not shown). In some embodiments, the analyzer is configured to directly detect and analyze a composition of the first substrate or the second substrate. In some embodiments, the first substrate is transported from the first processing chamber into the second processing chamber if the analyzer detects that the first substrate does not meet a design requirement. For example, if the analyzer detects that there are unwanted particles remaining on the surface of the first substrate, the first substrate is transported from the first processing chamber into the second processing chamber for finer cleaning processes. Additionally, if the analyzer detects that there are no unwanted particles on the surface of the second substrate, the second substrate is transported from the first processing chamber into the load lock chamber.

At operation 508, the first substrate is transported from the second processing chamber (e.g., the second chamber 106) into the load lock chamber 102. In some embodiments, the load lock chamber 102 is configured to cool the first substrate after the second wet process. In some alternative embodiments, the second substrate is transported from the first processing chamber (e.g., the first chamber 104) into the load lock chamber 102. In such embodiments, the load lock chamber 102 is configured to cool the second substrate after the first wet process. In some alternative embodiments, the processed first substrate is transported from the first processing chamber after the first wet process into the load lock chamber 102 prior to the second wet process. The processed first substrate and the processed second substrate may be further used in the manufacturing of a semiconductor structure or a semiconductor device.

The method is described for a purpose of illustrating concepts of the present disclosure, and the description is not intended to limit the present disclosure beyond what is explicitly recited in the claims. Additional operations can be provided before, during, and after the method described above and illustrated in FIG. 7, and some operations described can be replaced, eliminated, or rearranged for additional embodiments of the method.

In some alternative embodiments, the first substrate or the second substrate may be transported from the load lock chamber 102 to the second processing chamber (e.g., the second chamber 106) to perform a second wet process prior to the first wet process. For example, the first substrate and the second substrate may be subjected to a backside brushing procedure in the second chambers 106-1 and 106-2. Thereafter, the first substrate and the second substrate are respectively transferred from the second chambers 106-1 and 106-2 to the first process chamber (e.g., the first chamber 104) to perform a first wet process. For example, after the backside brushing procedure, the first substrate and the second substrate may be subjected to an SPM cleaning procedure. The first substrate and the second substrate are respectively transferred from the second chambers 106-1 and 106-2 to a single first chamber 104-1 to perform the first wet process. In some embodiments, after the first wet process, the first substrate and the second substrate are transferred from the first chamber 104-1 to second chambers 106-3 and 106-z to perform another second wet process (e.g., soft spray cleaning).

In some alternative embodiments, the first substrate and the second substrate may be subjected to a series of first wet processes in the first chambers 104 followed by one or more second wet processes in the second chambers 106. For example, the first substrate and the second substrate may be subjected to a first cleaning process (e.g., APM cleaning) in the first chamber 104-1. After the first cleaning process in the first chamber 104-1, the first substrate and the second substrate may be subjected to a second cleaning process (e.g., HPM cleaning) in the first chamber 104-2. After the second cleaning process in the first chamber 104-2, the first substrate and the second substrate may respectively be subjected to a third cleaning process (e.g., soft spray cleaning) in the second chambers 106-1 and 106-2. After the third cleaning processes in the second chambers 106-1 and 106-2, the first substrate and the second substrate may respectively be subjected to a fourth cleaning process (e.g., DHF cleaning) in a first chamber 104-3 (or 104-y). Alternatively, the first substrate and the second substrate may be subjected to a series of second wet processes in the second chambers 106 followed by one or more first wet processes in the first chambers 104.

The present disclosure provides embodiments of semiconductor structure manufacturing systems and methods for manufacturing a semiconductor structure. By integrating different processing chambers in the semiconductor structure manufacturing system, transportation time between different processing modules may be reduced. In addition, a footprint of the semiconductor structure manufacturing system may be reduced, thereby saving cleanroom space. Furthermore, by integrating the different processing chambers in the semiconductor structure manufacturing system, a yield of the semiconductor structure s may be improved due to in-situ processing procedure.

In accordance with some embodiments of the present disclosure, a system for wet processing is provided. The system includes a load lock chamber, a plurality of first chambers, a plurality of second chambers and a first robot. The load lock chamber is configured to store a plurality of wafers that are to be processed. The first chambers are configured to process the plurality of wafers. Each of the first chambers has a plurality of first stage plates for supporting the plurality of wafers. The second chambers are configured to process a single wafer of the plurality of wafers. Each of the second chambers has a second stage plate for supporting a wafer of the plurality of wafers. The first robot is configured to transport the plurality of wafers from the load lock chamber to the plurality of first chambers. The first robot is arranged between the plurality of first chambers, the plurality of second chambers and the load lock chamber.

In accordance with some embodiments of the present disclosure, a system for manufacturing a semiconductor structure is provided. The system includes a load port, a load lock chamber, a plurality of first chambers, a plurality of second chambers and a center robot. The load port is configured to accommodate a cassette for holding a plurality of substrates. The load lock chamber is configured to store the plurality of substrates. The load lock chamber is connected to a temperature control module. The first chambers are configured to process the plurality of substrates. Each of the second chambers is configured to process a single substrate of the plurality of substrates. The center robot is configured to transport the plurality of substrates from the load lock chamber to the plurality of first chambers. The plurality of first chambers are arranged on a first side of the center robot and the plurality of second chambers are arranged on a second side of the center robot.

In accordance with some embodiments of the present disclosure, a method of forming a semiconductor structure is provided. The method includes the following operations. A first substrate and a second substrate are transported from a load port into a load lock chamber. The first substrate and the second substrate are transported from the load lock chamber into a first processing chamber to perform a first wet process, wherein the first processing chamber has a plurality of first stage plates for supporting the first substrate and the second substrate. The first substrate is transported from the first processing chamber into a second processing chamber to perform a second wet process, wherein the second chamber has a second stage plate for supporting the first substrate. The first substrate is transported from the second processing chamber into the load lock chamber.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for wet processing, comprising:
 a load lock chamber, configured to store a plurality of wafers that are to be processed;
 a plurality of first chambers, configured to perform a first wet etching or a first wet cleaning on the plurality of wafers, wherein each of the plurality of first chambers has a plurality of first stage plates for supporting the plurality of wafers;
 a plurality of second chambers, configured to perform a second wet etching or a second wet cleaning on a single wafer of the plurality of wafers, wherein each of the plurality of second chambers has a second stage plate for supporting a wafer of the plurality of wafers; and
 a first robot, configured to transport the plurality of wafers from the load lock chamber to the plurality of first chambers,
 wherein the first robot is arranged between the plurality of first chambers, the plurality of second chambers and the load lock chamber,
 wherein one of the second chambers is disposed between two of the first chambers.

2. The system of claim 1, wherein the plurality of first chambers and the plurality of second chambers are arranged in an alternating order.

3. The system of claim 1, wherein the first robot is further configured to transport the plurality of wafers from the load lock chamber to the plurality of second chambers.

4. The system of claim 1, further comprising:
a plurality of load ports,
a second robot arranged between the plurality of load ports and the load lock chamber.

5. The system of claim 1, further comprising a temperature control module connected to the load lock chamber.

6. The system of claim 1, further comprising:
a chemical control module, configured to supply processing chemicals to the plurality of first chambers or the plurality of second chambers.

7. A system for manufacturing a semiconductor structure, comprising:
a load port, configured to accommodate a cassette for holding a plurality of substrates;
a load lock chamber, configured to store a plurality of substrates, wherein the load lock chamber is connected to a temperature control module;
a plurality of first chambers, configured to perform a first wet etching or a first wet cleaning on the plurality of substrates;
a plurality of second chambers, each configured to perform a second wet etching or a second wet cleaning on a single substrate of the plurality of substrates;
a first robot, configured to transport the plurality of substrates from the load lock chamber to the plurality of first chambers; and
a second robot, configured to transport one of the plurality of substrates from the load lock chamber to one of the plurality of second chambers,
wherein the plurality of first chambers are arranged on a first side of the first robot and the plurality of second chambers are arranged on a second side of the first robot.

8. The system of claim 7, further comprising:
a front robot, configured to transport the plurality of substrates from the load port to the load lock chamber.

9. The system of claim 7, wherein the plurality of first chambers and the plurality of second chambers comprise different processing chemicals.

10. The system of claim 7, wherein the plurality of first chambers and the plurality of second chambers comprise a same processing chemical.

11. A method for manufacturing a semiconductor structure, comprising:
transporting a plurality of substrates from a load port into a load lock chamber;
transporting the plurality of substrates from the load lock chamber into a first processing chamber to perform a first wet process, wherein the first processing chamber has a plurality of first stage plates for supporting the plurality of substrates;
transporting one of the plurality of substrates from the first processing chamber into a second processing chamber to perform a second wet process, wherein the second processing chamber has a second stage plate for supporting the one of the plurality of substrates; and
transporting the one of the plurality of substrates from the second processing chamber into the load lock chamber,
wherein the first wet process comprises a first wet etching or a first wet cleaning, and the second wet process comprises a second wet etching or a second wet cleaning.

12. The method of claim 11, wherein the load lock chamber is configured to store or heat the plurality of substrates before the first wet process or the second wet process.

13. The method of claim 11, wherein the load lock chamber is configured to cool the plurality of substrates after the first wet process or the second wet process.

14. The method of claim 11, further comprising:
transporting the processed one of the plurality of substrates from the first processing chamber after the first wet process into the load lock chamber prior to the second wet process.

15. The method of claim 11, wherein the first wet process and the second wet process comprise different processing chemicals.

16. The method of claim 11, wherein the first wet process and the second wet process comprise a same processing chemical.

17. The method of claim 11, further comprising:
detecting and analyzing the plurality of substrates after the first wet process by an analyzer.

18. The method of claim 17, wherein the one of the plurality of substrates is transported from the first processing chamber into the second processing chamber if the analyzer detects that the one of the plurality of substrates does not meet a design requirement.

19. The method of claim 11, further comprising changing a pressure in the load lock chamber to substantially equal to a pressure of the first processing chamber.

20. The method of claim 11, further comprising transporting the one of the plurality of substrate from the second processing chamber into the first processing chamber.

* * * * *